(12) United States Patent
Oak (10) Patent No.: US 8,199,037 B2
(45) Date of Patent: Jun. 12, 2012

(54) ADC CHANNEL SELECTION AND CONVERSION

(75) Inventor: Sunil S. Oak, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 56 days.

(21) Appl. No.: 12/915,312

(22) Filed: Oct. 29, 2010

(65) Prior Publication Data

US 2012/0105261 A1     May 3, 2012

(51) Int. Cl.
*H03M 1/00*     (2006.01)
(52) U.S. Cl. ........................... 341/141; 341/155
(58) Field of Classification Search .................. 341/141, 341/155, 156, 159, 160, 166, 120
See application file for complete search history.

(56) References Cited

U.S. PATENT DOCUMENTS 6,559,783 B1 * 5/2003 Stoneking ..................... 341/141

* cited by examiner

*Primary Examiner* — Joseph Lauture
(74) *Attorney, Agent, or Firm* — Lawrence J. Bassuk; W. James Brady; Frederick J. Telecky, Jr.

(57) ABSTRACT

A microcontroller includes a microcontroller core and an analog-to-digital converter ("ADC") coupled to said microcontroller core. The ADC has multiple input channel multiplexers that are configured to receive multiple analog input channels. The microcontroller further includes a selection register and a data structure. The data structure comprises a plurality of associated field sets. Each bit position in the selection register indexes to one of the associated field sets in the data structure, and the value contained in each such bit position indicates whether or not to select the corresponding associated field set for selection of an analog input channel. Each associated field set comprises one or more values collectively specifying an analog input channel to select for conversion to digital form.

20 Claims, 8 Drawing Sheets

| ADDRESS OFFSET | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0x00 | RESERVED ||| EV_EXT_CHN_MUX_SEL |||||  RESERVED ||| EV_INT_CHNSEL |||||
| 0x02 | RESERVED ||| EV_EXT_CHN_MUX_SEL ||||| RESERVED ||| EV_INT_CHNSEL |||||
| 0x04 | RESERVED ||| EV_EXT_CHN_MUX_SEL ||||| RESERVED ||| EV_INT_CHNSEL |||||
| 0x06 | RESERVED ||| EV_EXT_CHN_MUX_SEL ||||| RESERVED ||| EV_INT_CHNSEL |||||
| 0x08 | RESERVED ||| EV_EXT_CHN_MUX_SEL ||||| RESERVED ||| EV_INT_CHNSEL |||||
| 0x0A | RESERVED ||| EV_EXT_CHN_MUX_SEL ||||| RESERVED ||| EV_INT_CHNSEL |||||
| 0x0C | RESERVED ||| EV_EXT_CHN_MUX_SEL ||||| RESERVED ||| EV_INT_CHNSEL |||||
| 0x0E | RESERVED ||| EV_EXT_CHN_MUX_SEL ||||| RESERVED ||| EV_INT_CHNSEL |||||
| 0x10 | RESERVED ||| EV_EXT_CHN_MUX_SEL ||||| RESERVED ||| EV_INT_CHNSEL |||||
| 0x12 | RESERVED ||| EV_EXT_CHN_MUX_SEL ||||| RESERVED ||| EV_INT_CHNSEL |||||
| 0x14 | RESERVED ||| EV_EXT_CHN_MUX_SEL ||||| RESERVED ||| EV_INT_CHNSEL |||||
| 0x16 | RESERVED ||| EV_EXT_CHN_MUX_SEL ||||| RESERVED ||| EV_INT_CHNSEL |||||
| 0x18 | RESERVED ||| EV_EXT_CHN_MUX_SEL ||||| RESERVED ||| EV_INT_CHNSEL |||||
| 0x1A | RESERVED ||| EV_EXT_CHN_MUX_SEL ||||| RESERVED ||| EV_INT_CHNSEL |||||

FIG. 4B

| ADDRESS OFFSET | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0x1C | RESERVED ||| EV_EXT_CHN_MUX_SEL |||| RESERVED ||| EV_INT_CHNSEL ||||
| 0x1E | RESERVED ||| EV_EXT_CHN_MUX_SEL |||| RESERVED ||| EV_INT_CHNSEL ||||
| 0x20 | RESERVED ||| EV_EXT_CHN_MUX_SEL |||| RESERVED ||| EV_INT_CHNSEL ||||
| 0x22 | RESERVED ||| EV_EXT_CHN_MUX_SEL |||| RESERVED ||| EV_INT_CHNSEL ||||
| 0x24 | RESERVED ||| EV_EXT_CHN_MUX_SEL |||| RESERVED ||| EV_INT_CHNSEL ||||
| 0x26 | RESERVED ||| EV_EXT_CHN_MUX_SEL |||| RESERVED ||| EV_INT_CHNSEL ||||
| 0x28 | RESERVED ||| EV_EXT_CHN_MUX_SEL |||| RESERVED ||| EV_INT_CHNSEL ||||
| 0x2A | RESERVED ||| EV_EXT_CHN_MUX_SEL |||| RESERVED ||| EV_INT_CHNSEL ||||
| 0x2C | RESERVED ||| EV_EXT_CHN_MUX_SEL |||| RESERVED ||| EV_INT_CHNSEL ||||
| 0x2E | RESERVED ||| EV_EXT_CHN_MUX_SEL |||| RESERVED ||| EV_INT_CHNSEL ||||
| 0x30 | RESERVED ||| EV_EXT_CHN_MUX_SEL |||| RESERVED ||| EV_INT_CHNSEL ||||
| 0x32 | RESERVED ||| EV_EXT_CHN_MUX_SEL |||| RESERVED ||| EV_INT_CHNSEL ||||
| 0x34 | RESERVED ||| EV_EXT_CHN_MUX_SEL |||| RESERVED ||| EV_INT_CHNSEL ||||
| 0x36 | RESERVED ||| EV_EXT_CHN_MUX_SEL |||| RESERVED ||| EV_INT_CHNSEL ||||
| 0x38 | RESERVED ||| EV_EXT_CHN_MUX_SEL |||| RESERVED ||| EV_INT_CHNSEL ||||
| 0x3A | RESERVED ||| EV_EXT_CHN_MUX_SEL |||| RESERVED ||| EV_INT_CHNSEL ||||
| 0x3C | RESERVED ||| EV_EXT_CHN_MUX_SEL |||| RESERVED ||| EV_INT_CHNSEL ||||
| 0x3E | RESERVED ||| EV_EXT_CHN_MUX_SEL |||| RESERVED ||| EV_INT_CHNSEL ||||

FIG. 4C

| ADDRESS OFFSET | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0x40 | RESERVED | | | G1_EXT_CHN_MUX_SEL | | | | | RESERVED | | | G1_INT_CHNSEL | | | | |
| 0x42 | RESERVED | | | G1_EXT_CHN_MUX_SEL | | | | | RESERVED | | | G1_INT_CHNSEL | | | | |
| 0x44 | RESERVED | | | G1_EXT_CHN_MUX_SEL | | | | | RESERVED | | | G1_INT_CHNSEL | | | | |
| 0x46 | RESERVED | | | G1_EXT_CHN_MUX_SEL | | | | | RESERVED | | | G1_INT_CHNSEL | | | | |
| 0x48 | RESERVED | | | G1_EXT_CHN_MUX_SEL | | | | | RESERVED | | | G1_INT_CHNSEL | | | | |
| 0x4A | RESERVED | | | G1_EXT_CHN_MUX_SEL | | | | | RESERVED | | | G1_INT_CHNSEL | | | | |
| 0x4C | RESERVED | | | G1_EXT_CHN_MUX_SEL | | | | | RESERVED | | | G1_INT_CHNSEL | | | | |
| 0x4E | RESERVED | | | G1_EXT_CHN_MUX_SEL | | | | | RESERVED | | | G1_INT_CHNSEL | | | | |
| 0x50 | RESERVED | | | G1_EXT_CHN_MUX_SEL | | | | | RESERVED | | | G1_INT_CHNSEL | | | | |
| 0x52 | RESERVED | | | G1_EXT_CHN_MUX_SEL | | | | | RESERVED | | | G1_INT_CHNSEL | | | | |
| 0x54 | RESERVED | | | G1_EXT_CHN_MUX_SEL | | | | | RESERVED | | | G1_INT_CHNSEL | | | | |
| 0x56 | RESERVED | | | G1_EXT_CHN_MUX_SEL | | | | | RESERVED | | | G1_INT_CHNSEL | | | | |
| 0x58 | RESERVED | | | G1_EXT_CHN_MUX_SEL | | | | | RESERVED | | | G1_INT_CHNSEL | | | | |
| 0x5A | RESERVED | | | G1_EXT_CHN_MUX_SEL | | | | | RESERVED | | | G1_INT_CHNSEL | | | | |
| 0x5C | RESERVED | | | G1_EXT_CHN_MUX_SEL | | | | | RESERVED | | | G1_INT_CHNSEL | | | | |
| 0x5E | RESERVED | | | G1_EXT_CHN_MUX_SEL | | | | | RESERVED | | | G1_INT_CHNSEL | | | | |
| 0x60 | RESERVED | | | G1_EXT_CHN_MUX_SEL | | | | | RESERVED | | | G1_INT_CHNSEL | | | | |
| 0x62 | RESERVED | | | G1_EXT_CHN_MUX_SEL | | | | | RESERVED | | | G1_INT_CHNSEL | | | | |

FIG. 4D

| ADDRESS OFFSET | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0x64 | RESERVED ||| G1_EXT_CHN_MUX_SEL ||||| RESERVED ||| G1_INT_CHNSEL |||||
| 0x66 | RESERVED ||| G1_EXT_CHN_MUX_SEL ||||| RESERVED ||| G1_INT_CHNSEL |||||
| 0x68 | RESERVED ||| G1_EXT_CHN_MUX_SEL ||||| RESERVED ||| G1_INT_CHNSEL |||||
| 0x6A | RESERVED ||| G1_EXT_CHN_MUX_SEL ||||| RESERVED ||| G1_INT_CHNSEL |||||
| 0x6C | RESERVED ||| G1_EXT_CHN_MUX_SEL ||||| RESERVED ||| G1_INT_CHNSEL |||||
| 0x6E | RESERVED ||| G1_EXT_CHN_MUX_SEL ||||| RESERVED ||| G1_INT_CHNSEL |||||
| 0x70 | RESERVED ||| G1_EXT_CHN_MUX_SEL ||||| RESERVED ||| G1_INT_CHNSEL |||||
| 0x72 | RESERVED ||| G1_EXT_CHN_MUX_SEL ||||| RESERVED ||| G1_INT_CHNSEL |||||
| 0x74 | RESERVED ||| G1_EXT_CHN_MUX_SEL ||||| RESERVED ||| G1_INT_CHNSEL |||||
| 0x76 | RESERVED ||| G1_EXT_CHN_MUX_SEL ||||| RESERVED ||| G1_INT_CHNSEL |||||
| 0x78 | RESERVED ||| G1_EXT_CHN_MUX_SEL ||||| RESERVED ||| G1_INT_CHNSEL |||||
| 0x7A | RESERVED ||| G1_EXT_CHN_MUX_SEL ||||| RESERVED ||| G1_INT_CHNSEL |||||
| 0x7C | RESERVED ||| G1_EXT_CHN_MUX_SEL ||||| RESERVED ||| G1_INT_CHNSEL |||||
| 0x7E | RESERVED ||| G1_EXT_CHN_MUX_SEL ||||| RESERVED ||| G1_INT_CHNSEL |||||
| 0x80 | RESERVED ||| G2_EXT_CHN_MUX_SEL ||||| RESERVED ||| G2_INT_CHNSEL |||||
| 0x82 | RESERVED ||| G2_EXT_CHN_MUX_SEL ||||| RESERVED ||| G2_INT_CHNSEL |||||
| 0x84 | RESERVED ||| G2_EXT_CHN_MUX_SEL ||||| RESERVED ||| G2_INT_CHNSEL |||||
| 0x86 | RESERVED ||| G2_EXT_CHN_MUX_SEL ||||| RESERVED ||| G2_INT_CHNSEL |||||

FIG. 4E

| ADDRESS OFFSET | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0x88 | RESERVED | | | G2_EXT_CHN_MUX_SEL | | | | | RESERVED | | | G2_INT_CHNSEL | | | | |
| 0x8A | RESERVED | | | G2_EXT_CHN_MUX_SEL | | | | | RESERVED | | | G2_INT_CHNSEL | | | | |
| 0x8C | RESERVED | | | G2_EXT_CHN_MUX_SEL | | | | | RESERVED | | | G2_INT_CHNSEL | | | | |
| 0x8E | RESERVED | | | G2_EXT_CHN_MUX_SEL | | | | | RESERVED | | | G2_INT_CHNSEL | | | | |
| 0x90 | RESERVED | | | G2_EXT_CHN_MUX_SEL | | | | | RESERVED | | | G2_INT_CHNSEL | | | | |
| 0x92 | RESERVED | | | G2_EXT_CHN_MUX_SEL | | | | | RESERVED | | | G2_INT_CHNSEL | | | | |
| 0x94 | RESERVED | | | G2_EXT_CHN_MUX_SEL | | | | | RESERVED | | | G2_INT_CHNSEL | | | | |
| 0x96 | RESERVED | | | G2_EXT_CHN_MUX_SEL | | | | | RESERVED | | | G2_INT_CHNSEL | | | | |
| 0x98 | RESERVED | | | G2_EXT_CHN_MUX_SEL | | | | | RESERVED | | | G2_INT_CHNSEL | | | | |
| 0x9A | RESERVED | | | G2_EXT_CHN_MUX_SEL | | | | | RESERVED | | | G2_INT_CHNSEL | | | | |
| 0x9C | RESERVED | | | G2_EXT_CHN_MUX_SEL | | | | | RESERVED | | | G2_INT_CHNSEL | | | | |
| 0x9E | RESERVED | | | G2_EXT_CHN_MUX_SEL | | | | | RESERVED | | | G2_INT_CHNSEL | | | | |
| 0xA0 | RESERVED | | | G2_EXT_CHN_MUX_SEL | | | | | RESERVED | | | G2_INT_CHNSEL | | | | |
| 0xA2 | RESERVED | | | G2_EXT_CHN_MUX_SEL | | | | | RESERVED | | | G2_INT_CHNSEL | | | | |
| 0xA4 | RESERVED | | | G2_EXT_CHN_MUX_SEL | | | | | RESERVED | | | G2_INT_CHNSEL | | | | |
| 0xA6 | RESERVED | | | G2_EXT_CHN_MUX_SEL | | | | | RESERVED | | | G2_INT_CHNSEL | | | | |
| 0xA8 | RESERVED | | | G2_EXT_CHN_MUX_SEL | | | | | RESERVED | | | G2_INT_CHNSEL | | | | |
| 0xAA | RESERVED | | | G2_EXT_CHN_MUX_SEL | | | | | RESERVED | | | G2_INT_CHNSEL | | | | |

FIG. 4F

| ADDRESS OFFSET | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0xAC | RESERVED ||| G2_EXT_CHN_MUX_SEL |||||  RESERVED ||| G2_INT_CHNSEL ||||
| 0xAE | RESERVED ||| G2_EXT_CHN_MUX_SEL ||||| RESERVED ||| G2_INT_CHNSEL ||||
| 0xB0 | RESERVED ||| G2_EXT_CHN_MUX_SEL ||||| RESERVED ||| G2_INT_CHNSEL ||||
| 0xB2 | RESERVED ||| G2_EXT_CHN_MUX_SEL ||||| RESERVED ||| G2_INT_CHNSEL ||||
| 0xB4 | RESERVED ||| G2_EXT_CHN_MUX_SEL ||||| RESERVED ||| G2_INT_CHNSEL ||||
| 0xB6 | RESERVED ||| G2_EXT_CHN_MUX_SEL ||||| RESERVED ||| G2_INT_CHNSEL ||||
| 0xB8 | RESERVED ||| G2_EXT_CHN_MUX_SEL ||||| RESERVED ||| G2_INT_CHNSEL ||||
| 0xBA | RESERVED ||| G2_EXT_CHN_MUX_SEL ||||| RESERVED ||| G2_INT_CHNSEL ||||
| 0xBC | RESERVED ||| G2_EXT_CHN_MUX_SEL ||||| RESERVED ||| G2_INT_CHNSEL ||||
| 0xBE | RESERVED ||| G2_EXT_CHN_MUX_SEL ||||| RESERVED ||| G2_INT_CHNSEL ||||

FIG. 5

ADC CHANNEL SELECTION AND CONVERSION

BACKGROUND

Many microcontrollers are designed for embedded applications, and are used in automatically controlled products and devices such as automobile engine control systems, implantable medical devices, remote controls, office machines, appliances, power tools, toys, etc. Mixed signal microcontrollers integrate analog components needed to control non-digital electronic systems.

An analog-to-digital converter ("ADC") converts a continuous quantity (e.g. an analog signal) to a series of discrete quantities (e.g. a digital signal). Typically, an ADC is an electronic device that converts an input analog voltage or current to a digital number proportional to the magnitude of the voltage or current. The resolution of the ADC, usually expressed as binary bits, indicates the number of discrete values the ADC can produce over the range of analog values. As such, the number of discrete values available, or "levels," is usually a power of two. For example, an ADC with a resolution of 8 bits can encode an analog input to one of 256 different levels because an 8-bit binary value can represent $2^8$ or 256 discrete quantities. However, the flexibility of coding levels has not resulted in flexibility of input channel selection and conversion timing. Indeed, ADC designs have restrictive and inefficient constraints placed on channel selection and conversion timing.

SUMMARY

The restrictive and inefficient constraints placed on conversion of input channels in ADCs located on microcontrollers are eliminated using this disclosure.

In at least one embodiment, a microcontroller includes a microcontroller core and an analog-to-digital converter ("ADC") coupled to said microcontroller core. The ADC has multiple input channel multiplexers that are configured to receive multiple analog input channels. The microcontroller further includes a selection register and a data structure. The data structure comprises a plurality of associated field sets. Each bit position in the selection register indexes to one of the associated field sets in the data structure, and the value contained in each such bit position indicates whether or not to select the corresponding associated field set for selection of an analog input channel. Each associated field set comprises one or more values collectively specifying an analog input channel to select for conversion to digital form.

In at least one embodiment, an apparatus includes a microcontroller including an analog-to-digital converter ("ADC"). Multiple channels are selected for conversion in one round of conversion by the ADC via a binary value in a register. A channel identified with a higher index is converted by the ADC core before a channel identified with a lower index in a round of conversion. Each bit of the binary value corresponds to a plurality of address offsets in memory. A value beginning at an address offset, out of the plurality of address offsets, is used to select one of the multiple channels.

In at least one embodiment, a method includes reading a binary value in a channel select register. The method further includes selecting multiple channels for conversion in one round of conversion by an analog-to-digital converter ("ADC") based on the value. A channel identified with a higher index is converted by the ADC core before a channel identified with a lower index in a round of conversion.

BRIEF DESCRIPTION OF THE DRAWINGS

Reference will now be made to the accompanying drawings, in which.

NOTATION AND NOMENCLATURE

Certain terms are used throughout the following claims and description to refer to particular components. As one skilled in the art will appreciate, different entities may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean an optical, wireless, indirect electrical, or direct electrical connection. Thus, if a first device couples to a second device, that connection may be through an indirect electrical connection via other devices and connections, through a direct optical connection, etc. Additionally, the term "system" refers to a collection of two or more hardware components, and may be used to refer to an electronic device or a subsystem of an electronic device.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
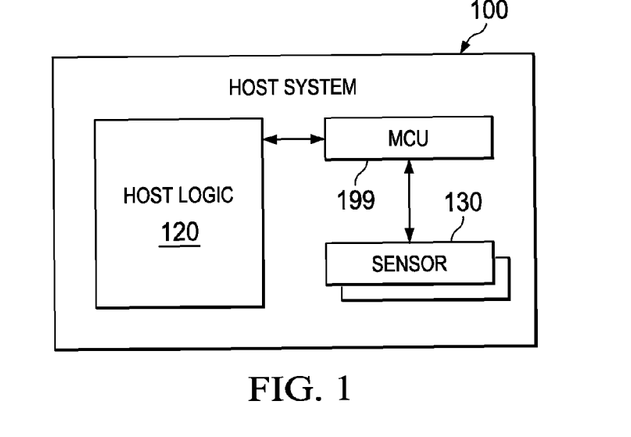
FIG. 1 shows a system including an embedded microcontroller according to at least one illustrated embodiment.

FIG. 1 illustrates a host system 100 in accordance with various embodiments of the invention. As shown, host system 100 includes host logic 120 coupled to one or more microcontroller units ("MCUs") 199, which are coupled to one or more sensors 130. The host system 100 can perform any of a variety of functions. For example, the host system 100 may be a medical device (e.g., an electrocardiograph), an antilock brake system for an automobile, etc. The host logic 120 may include a microprocessor, memory (containing software executed by the microprocessor), and other components not shown that imbue the host system 100 with some or all of its functionality. The sensors 130 may be any type of sensors relevant to the operation of the host system 100, and the sensors are analog sensors in at least one embodiment. Examples of sensors 130 include temperature sensors, pressure sensors, speed sensors, and the like. Only a single sensor 130 may be included in some embodiments, while in other embodiments, multiple sensors 130 may be included.

The embedded MCU 199 may perform a variety of functions. One such function is to convert one or more analog signals to digital form. For example, the output signals from sensors 130 may be in analog form (analog current or analog voltage). Such analog signals are provided to the MCU 199, which includes an analog-to-digital converter ("ADC") (not shown). The links between the sensors 130 and the MCU 199 are referred to as "channels." The MCU's 199 ADC converts the received analog sensor channel signals to digital values and provides those digital values to the host system's 100 host logic 120 for use in performing its functionality. Some host systems 100 may have multiple sensors 130 or other types of devices that produce analog signals needing conversion to digital form. The MCU 199 includes selection logic (discussed below) that selects analog input channels for conversion to digital form.

Figure 2:
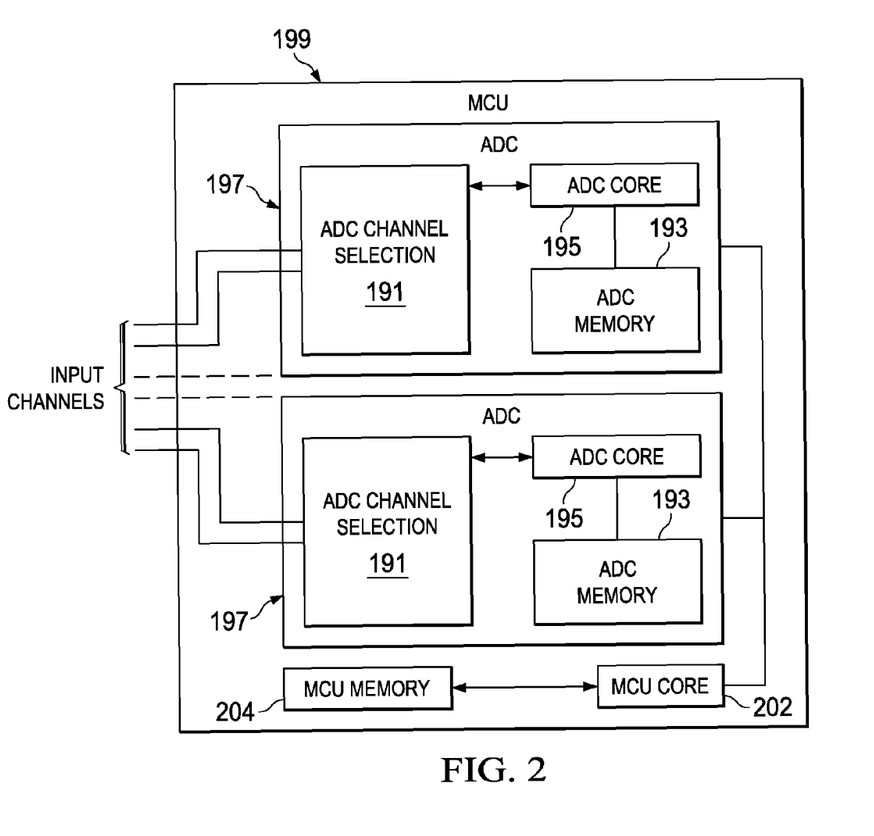
FIG. 2 shows a microcontroller including one or more ADCs according to at least one illustrated embodiment.

FIG. 2 illustrates a preferred embodiment of MCU 199. The MCU 199 of FIG. 2 comprises one or more ADCs 197. Each ADC 197 includes ADC channel selection (ADC CH SEL) logic 191 coupled to an ADC core 195, which is coupled to ADC memory 193. Other or different components may be present as well in other embodiments. Each ADC 197 is coupled to the MCU core 202, which is coupled to the MCU memory 204. The ADC channel selection logic 191 receives one or more input channels over which analog signals are provided to the corresponding ADC 197. As explained below, the interaction of the ADC core 195 and ADC channel selection logic 191 controls which input channel to select at any point in time for conversion to a digital value. The digital value is provided to the MCU core 202 for use in the various functions of the MCU core 202. The digital value may be stored in ADC memory 193 or in MCU memory 204 for later use. In accordance with various embodiments of the invention, the analog input channels are selected in a way that provides flexibility and efficiency in conversion time, productivity, and choice.

Figure 3:
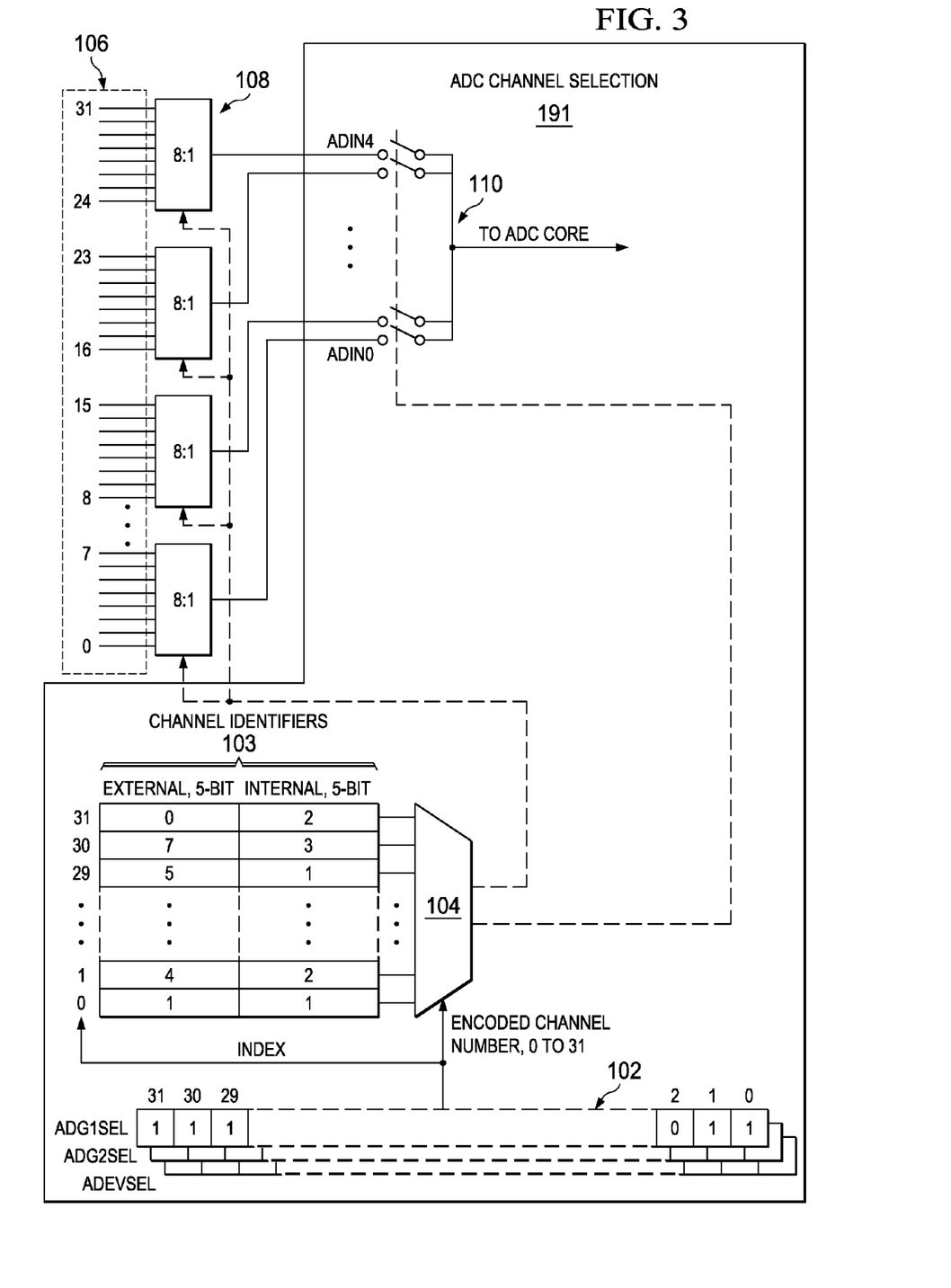
FIG. 3 illustrates channel selection for an ADC according to at least one preferred embodiment.
Figure 4A:
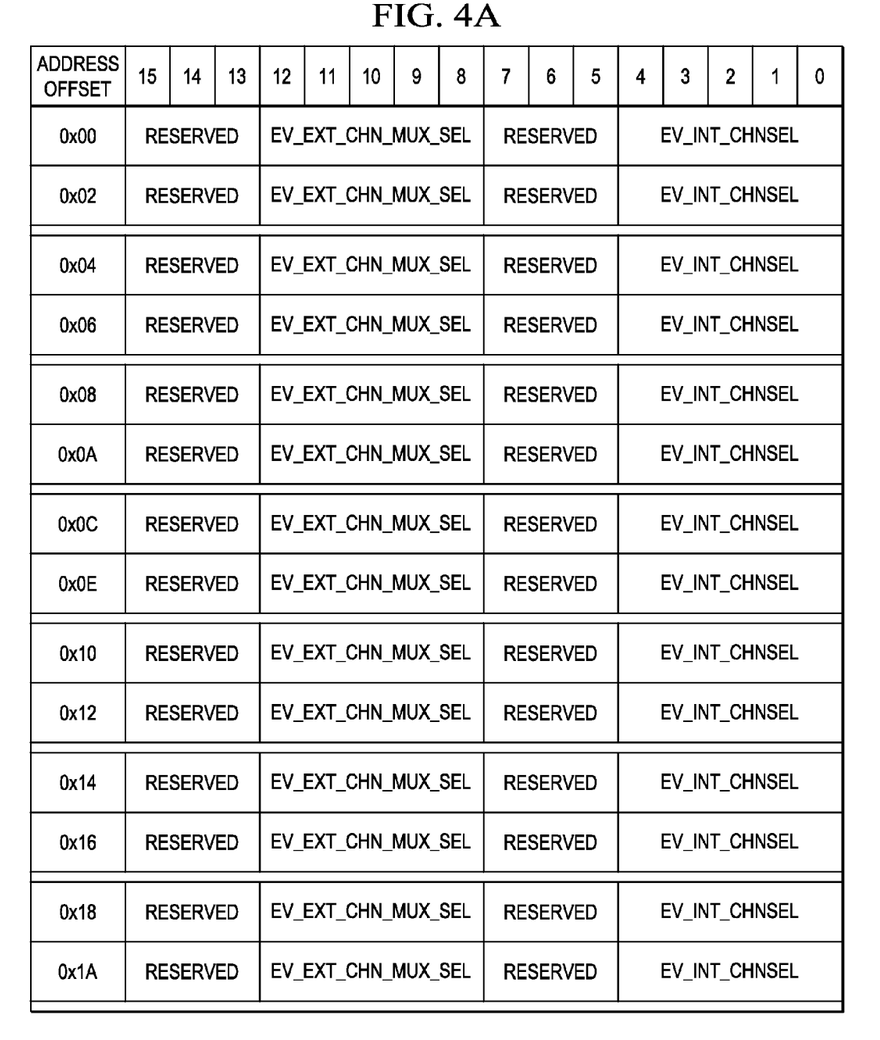
FIG. 4 illustrate memory usage for an ADC according to at least one preferred embodiment.
Figure 4B:
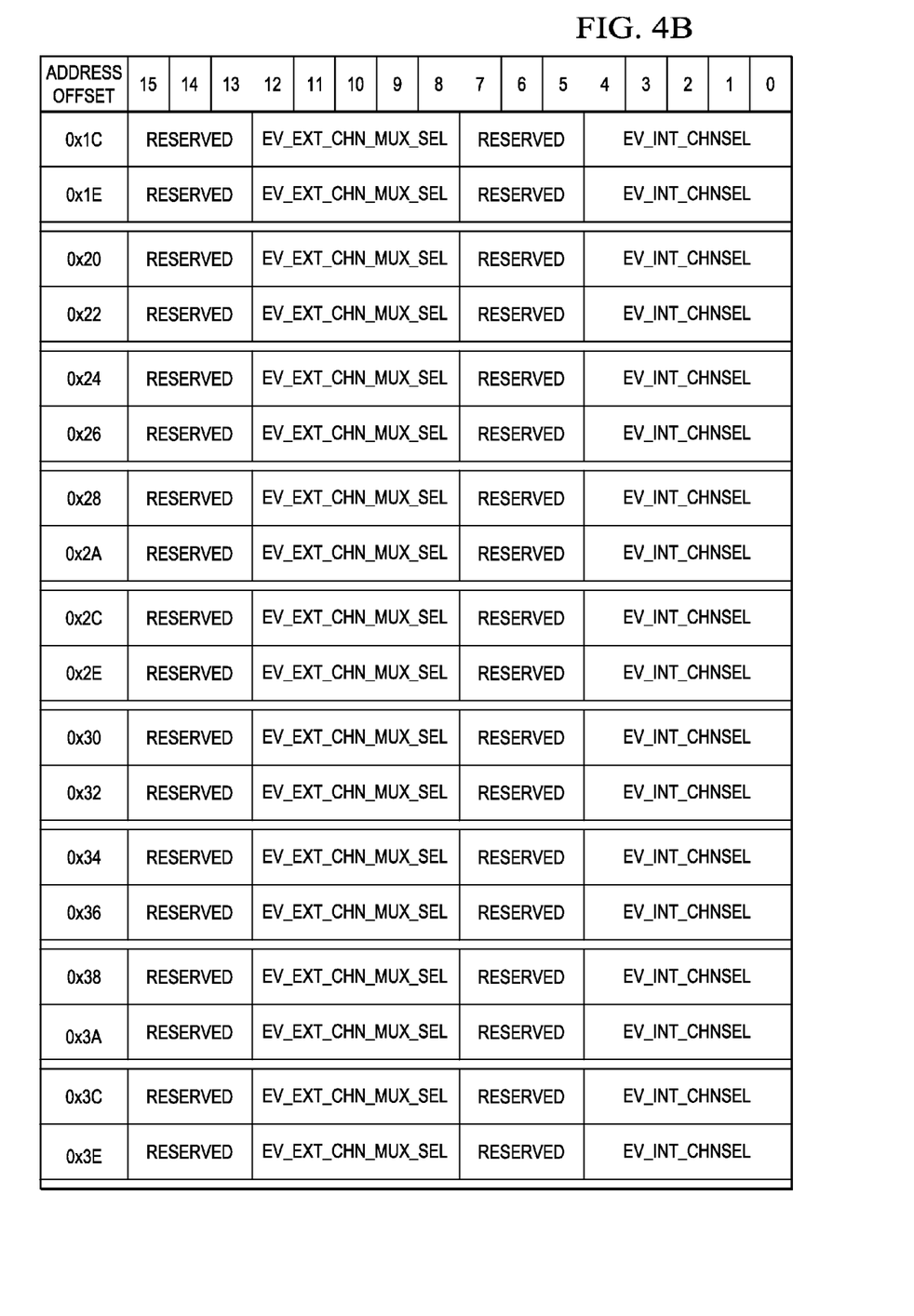
Figure 4C:
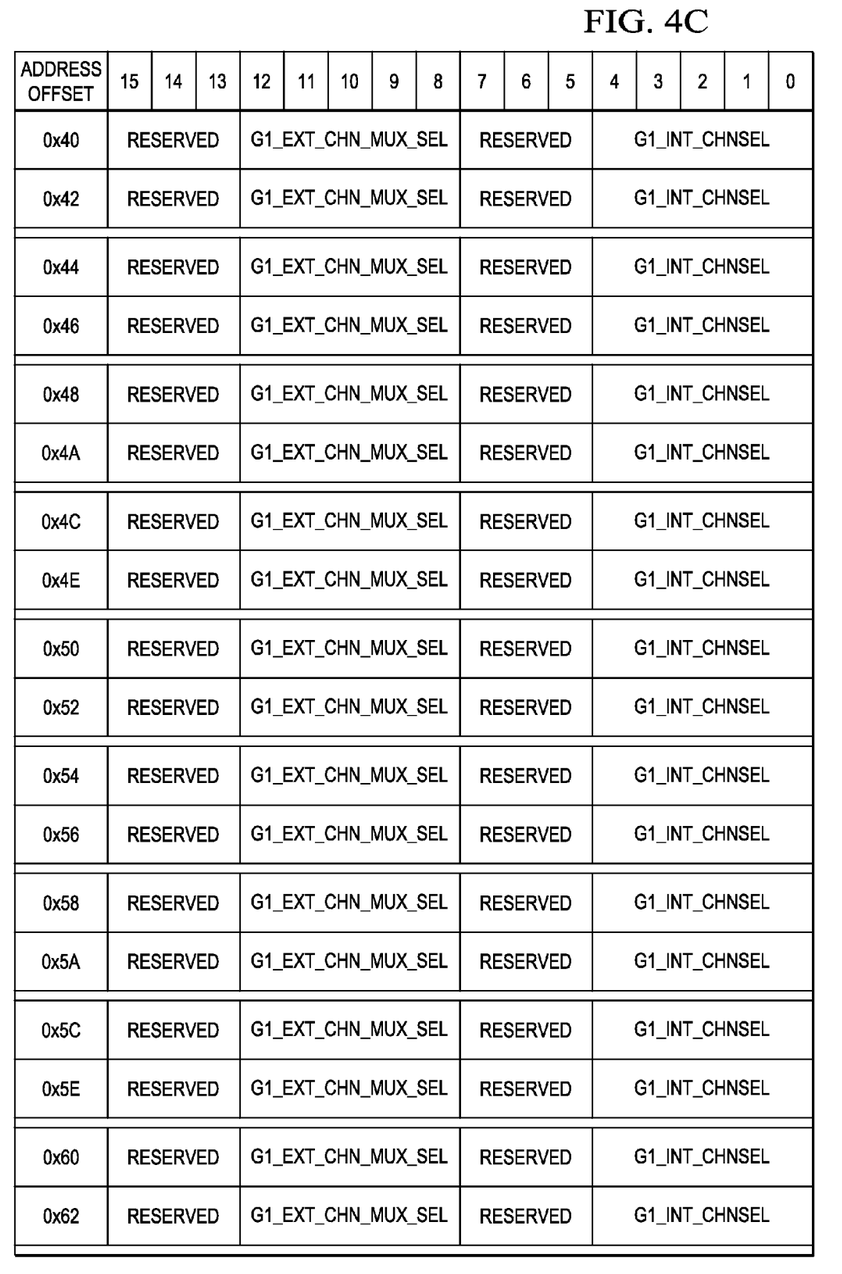
Figure 4D:
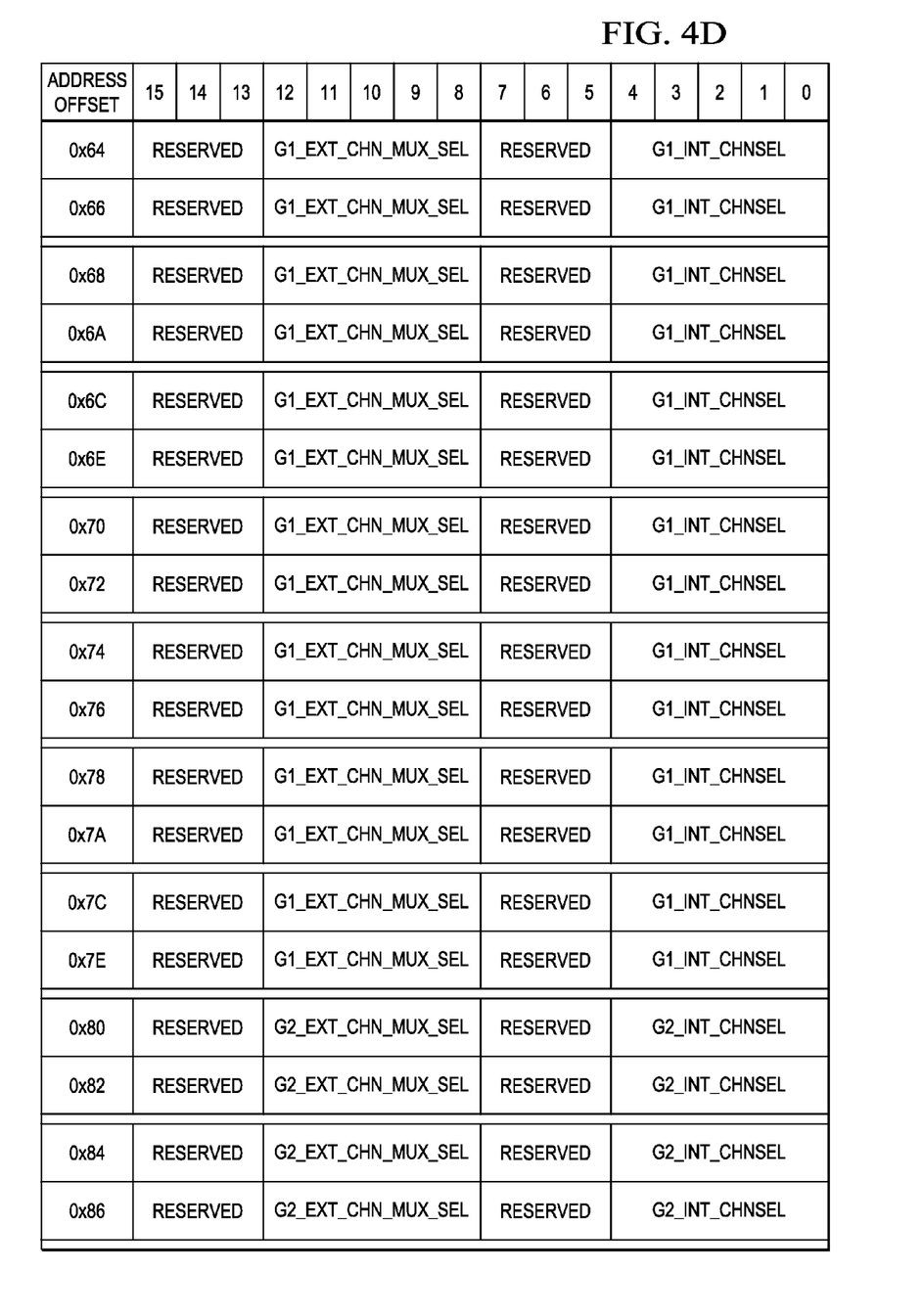
Figure 4E:
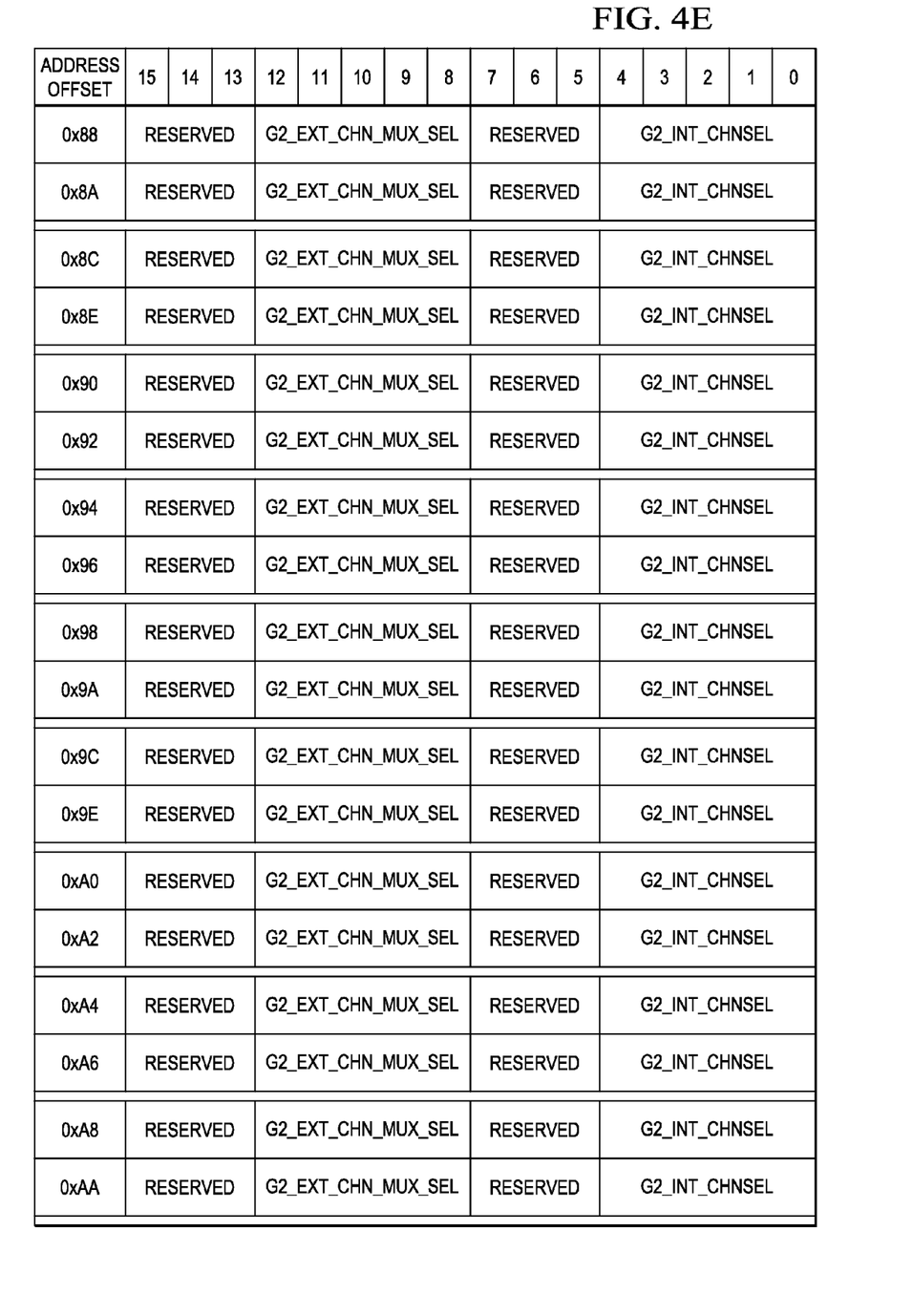
Figure 4F:
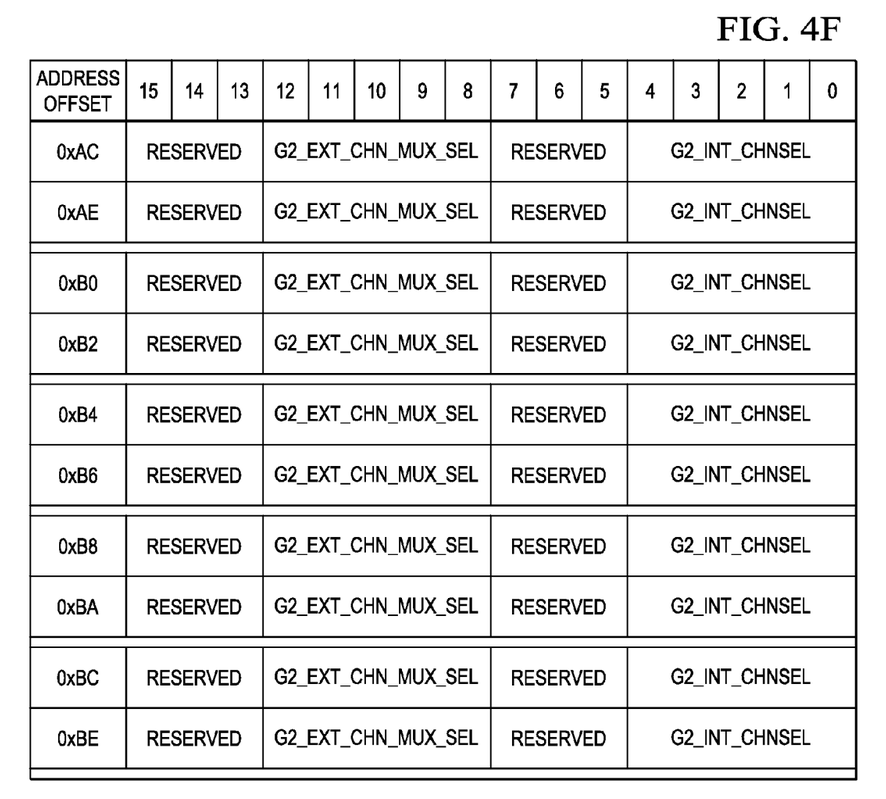

FIG. 3 shows a preferred embodiment of ADC channel selection logic 191. The embodiment of FIG. 3 shows one or more multiplexers 108 which receive the analog input channels 106, and one solid state switch 110 for each multiplexer 108. The switches 108 are controlled by an input multiplexer 104. In turn, the input multiplexer 104 is controlled by the bits of one or more channel-select registers 102 and a data structure 103. As illustrated, the data structure 103 is a table, but any data structure can be used. Preferably, the data structure comprises a plurality of associated field sets. An associated field set is multiple fields or variables, each capable of containing a value, that are associated or linked in some fashion. In the case of the table data structure, an associated field set is a row and the table comprises multiple rows or multiple associated field sets. The channel-select registers 102 may reside in the ADC core 195 or in ADC memory 193 (FIG. 2). The table 103 may reside in ADC memory 193, which is random access memory ("RAM") in at least one embodiment.

An index number is assigned to each analog input channel. As shown in FIG. 3, the bottom-most channel has an index of 0 while the top-most channel on that particular multiplexer 108 has an index of 7. Similarly, the bottom-most channel on the next multiplexer has an index of 8, while the top-most channel on that particular multiplexer 108 has an index of 15. Accordingly, all 32 channels shown in the example of FIG. 3 are uniquely indexed with an integer from 0-31. In various embodiments, any number of input channels 106 are supported with any number of analog multiplexers 108. For example, 32 analog multiplexers 108 may be provided in some embodiments to support 1024 input channels. As such, the channels would be indexed with the integers from 0 to 1023.

The input multiplexer 104 causes the analog input channels 106 to be selectively coupled to the input of the ADC core 195 one analog input channel 106 at a time in at least one embodiment. The ADC core 195 converts the selected analog input channel 106 to digital form. In various embodiments, the analog input channels chosen for conversion to digital values are based on one or more of three registers 102. The three registers correspond to three conversion groups; although in various embodiments, any number of conversion groups may be used. A conversion group is a set of asserted and unasserted channels that potentially can be converted based on the same "trigger." A trigger can be any event in hardware or software. For example, a trigger may be an elapse of a fixed time, a read or write to memory or a register, a variable crossing a threshold, etc. Any channel may be part of any conversion group while simultaneously being part of any number of other conversion groups. For the example described herein, the conversion groups are referred to as group 1, group 2, and event group. As such, there are three registers 102: group 1 ("ADG1SEL") register, group 2 ("ADG2SEL") register, or the event group ("ADEVSEL") register. The ADG2SEL register and the ADEVSEL register behave similarly to the ADG1SEL register, but the corresponding conversion groups need not be identical. Multiple channels are selected for conversion from analog to digital form in one "round" of conversion via ADG1SEL register 102. One round of conversion means to convert the asserted channels in a conversion group based on one activation of a trigger.

Table 103 in conjunction with ADG1SEL register 102 identifies which channels are asserted, i.e. selected to be converted to digital form, and which channels are unasserted. As shown, ADG1SEL register 102 contains a binary value. Specifically, position zero of the register 102 (the least significant bit) contains a 1, position one contains a 1, position two contains a 0, and positions 29-31 (the most significant bits) each contain a 1. For purposes of discussion of the example of FIG. 3, all other bit positions in register 102 contain a 0. Also for purposes of discussion, a 1 refers to an asserted bit, while a 0 refers to an unasserted bit. However, other embodiments, 0 can represent asserted bits and 1 can represent unasserted bits.

Instead of the bit positions in the binary value representing a channel, the bit positions of the binary value of register 102 correspond with indices of table 103 as shown in a vertical column on the left of table 103. Specifically, each row of table 103 has a table index of an integer between 0 and 31 corresponding to the 32 analog input channels. Also, each row of table 103 comprises external and internal channel identifiers as shown as integers in boxes under the heading "Channel identifiers" in table 103. An external channel identifier is a value driven to the analog multiplexers 108, which are external to the ADC channel selection logic 191 in at least one embodiment. An internal channel identifier is a value driven to the switches 110, which are internal to the ADC channel selection logic 191 in at least one embodiment.

In the example of FIG. 3, there are four 8-to-1 multiplexers 108. Each multiplexer 108 has eight input channels and selects a signal on one of the eight input lines on its single output line based on a control signal 105 from multiplexer 104. The same control signal 105 is provided to all four multiplexers 108. Thus, the corresponding input channels on each multiplexer 108 are selected based on the control signal 104. Further, there is switch 110 for each multiplexer 108. Another control signal 107, provided by the multiplexer 104, selects one of the four switches 110. Thus, control signal 105 selects which input channel to each multiplexer 108 is selected as an output from the multiplexers and control signal 107 causes a specific switch 110 to select one of the four multiplexer 108 output signals to provide to the ADC core for conversion to digital format.

One round of conversion is conducted in the order of bit positions 0-31 in the ADG1SEL register 102 in at least one embodiment. For example, bit position 0 is selected. As such, the row with an index of 0 is read from the table 103. The external channel identifier is 1. As such, the channels in position 1 (one above the bottom) on each analog multiplexer 108 have the potential to be selected. The internal channel identifier is also 1. As such, the analog multiplexer 108 in position 1 (one above the bottom) is selected because the corresponding switch 108 is closed. As a result, the channel with a channel index of 9 is selected for conversion and converted.

Next, bit position 1 in register 102 is selected. As such, the row with an index of 1 is read from the table 103. The external channel identifier is 4. As such, the channels in position 4 (fifth from the bottom) on each analog multiplexer 108 have the potential to be selected. The internal channel identifier is 2. As such, the analog multiplexer 108 in position 2 (third from the bottom) is selected because the corresponding switch 108 is closed. As a result, the channel with a channel index of 20 is selected for conversion and converted.

Next, bit positions 2-28 are not selected. No action is taken.

Next, bit position 29 is selected. As such, the row with an index of 29 is read from the table 103. The external channel identifier is 5. As such, the channels in position 5 (sixth from the bottom) on each analog multiplexer 108 have the potential to be selected. The internal channel identifier is 1. As such, the analog multiplexer 108 in position 1 (one above the bottom) is selected because the corresponding switch 108 is closed. As a result, the channel with a channel index of 13 is selected for conversion and converted. Note that channel 20, having a higher index, was converted prior to channel 13, having a lower index, in this round.

Next, bit position 30 is selected. As such, the row with an index of 30 is read from the table 103. The external channel identifier is 7. As such, the channels in position 7 (the top) on each analog multiplexer 108 have the potential to be selected. The internal channel identifier is 3. As such, the analog multiplexer 108 in position 3 (the top) is selected because the corresponding switch 108 is closed. As a result, the channel with a channel index of 31 is selected for conversion and converted.

Next, bit position 31 is selected. As such, the row with an index of 31 is read from the table 103. The external channel identifier is 0. As such, the channels in position 0 (the bottom) on each analog multiplexer 108 have the potential to be selected. The internal channel identifier is 2. As such, the analog multiplexer 108 in position 2 (third from the bottom) is selected because the corresponding switch 108 is closed. As a result, the channel with a channel index of 16 is selected for conversion and converted.

In the preceding example, 5 channels were converted in the round. The order of conversion was channels 9, 20, 13, 31, and 16. If the row with the index of 31 was re-written to comprise an internal channel identifier of 1 and an external channel identifier of 1 (similar to the row with the index of 0), then the order of conversion on the next round, assuming the same bit positions are asserted, would be channels 9, 20, 13, 31, and 9. Specifically, channel 9 would be selected and converted twice to digital form.

FIG. 4 illustrates how the table 103 is implemented in ADC memory 193 in at least one embodiment. Each bit position of ADEVSEL register 102 represents an address offset index corresponding to a row, just as in table 103. An address offset is the distance away from a reference location in memory. Each row comprises 16 bits, as illustrated in the header row. Each row comprises contains an external 5-bit channel identifier ("EV_EXT_CHN_MUX_SEL") and an internal 5-bit channel identifier ("EV_INT_CHNSEL"). Instead of decimal values as in table 103, the internal and external channel identifiers are binary values. The external channel identifier occupies bits 8-12, and the internal channel identifier occupies bits 0-4.

Here, the table starts at 0x00, corresponding to bit position 0. Next, bit position 1 corresponds to the row identified with address offset 0x02 and so on until bit position 31, which corresponds to the row identified with address offset 0x3E. Next at address offset 0x40, the row corresponding to bit position 0 for ADG1SEL begins. Next at address offset 0x80, the row corresponding to bit position 0 for ADG2SEL begins.

In at least one embodiment, the bit positions in a register 102 correspond to address offsets in memory in a one-to-one ratio. Additionally, the memory is random access memory ("RAM") of the MCU, and an amount of each address offset is proportional to the significance of the corresponding bit within the binary value.

As such, table 103 in conjunction with ADG1SEL register 102 allows a channel identified with a higher index to be converted by the ADC core 195 before a channel identified with a lower index in the same round of conversion. Also, if each bit in the binary value represented an analog input channel, e.g. position 0 represented analog input channel 0; position 1 represented analog input channel 1; etc., the ADC is not restricted to converting the round in order of increasing significance of each asserted bit. That is, the ADC 197 would not convert channel 0 first, channel 1 second, etc. Rather, the channels can be converted in any order including a customizable order.

Six bits in each row are reserved in at least one embodiment. For example as illustrated, bits 5-7 and 13-15 are reserved in each row of FIG. 4. If not reserved, there are many uses for the bits. For example, the bits can be used to select a number of times to convert one channel in the one round of conversion. Because this region is implemented as a MCU CORE-writeable memory, the order of channels to be converted is easily configured by writing channel identifier values at the address offsets. Just as illustrated in the example using table 103, if the value at one address offset is written such that it is equal to a second value at a second address offset, then when both corresponding bit positions are asserted in the register, the same channel is selected twice in one round of conversion. In this way, the same channel can be selected as many times as there are bits in the register for one round of conversion.

In at least one embodiment, a sequencer controls the order and the timing of conversions. Additionally, the conversion groups may be configured for a continuous conversion mode. Continuous conversion mode begins on a trigger, and results in one round of conversion after another until another trigger halts conversion.

The ADC RAM can be initialized automatically using a port in at least one embodiment. Additionally, the initialization can be triggered via one clock pulse. By keeping all input channel-select registers programmed to 0, the ADC will not be in any conversion modes during initialization. The length of the initialization process depends upon the depth of RAM present in the ADC because the entire RAM is initialized to 0 in at least one embodiment. Another pulse indicates that ADC RAM is fully initialized, and a dedicated bit can indicate the status of initialization. If parity memory locations are present, then the parity memory locations corresponding to each memory location can be initialized as well.

Data can be read out of a memory region by either the MCU CORE or, if included, a direct memory access ("DMA") controller. Each memory region can be read at the same time as a new conversion result is stored in it by the ADC 197. If there is an attempt to read out more conversion results than are stored in a conversion group's buffer, an empty flag bit can be set. An empty location is defined as one that does not contain any valid conversion data not yet read. The empty bit can be checked to verify that the conversion data is indeed valid.

In at least one embodiment, the ADC 197 generates one DMA request for each conversion result written into a conversion group's memory buffer. Therefore, an empty buffer read will not occur during normal operation in this embodiment. However, the empty flag can be checked as a precaution. Additionally, a DMA request can be generated for a block of conversions instead of for each conversion. The number of blocks of conversion is programmable for each conversion group. Finally, there is an option to generate a DMA request when all channels selected for conversion in a group have been converted and the results are stored in the ADC memory 193.

If the MCU CORE is used to read from a conversion group's memory buffer, a load multiple ("LDM") instruction enables the loading of multiple registers from memory with back-to-back read operations. Finally, a group memory overrun occurs when a memory region is full and the MCU core attempts to write data into the region while no data is being read from the region. If this occurs, the ADC memory 193 blocks the write (does not allow an overwrite to occur) and goes into an "overrun" state. In the overrun state, no new data can be written to the conversion group's memory region (new conversions are lost), but the data already in the region can be read either by the MCU CORE or DMA. Alternatively, the region can be either completely read out or discarded (allowing the data to be overwritten).

Conversion groups 1 and 2 are software-triggered in at least one embodiment. A conversion in these groups can be started by writing a non-zero value to the ADG1SEL and ADG2SEL registers, respectively. Additionally, the event group is hardware-triggered, and a conversion in the event group starts when a non-zero value is present in the ADEVSEL register. In both cases, the MCU core 202 may initiate the writing of the non-zero value based on the trigger and may reset the registers 102 to zero when conversion is complete. In at least one embodiment, the registers 102 are registers of the MCU 199; although in other embodiments, the registers 102 are registers of the ADC 197. In various embodiments, each of the conversion groups is hardware and software-triggered. Any channel can be selected in any group, and same channel can be selected in more than one group. It is also possible to select all channels or no channels within a group in at least one embodiment.

In at least one embodiment, a microcontroller 199 comprises two or more analog-to-digital converter ("ADCs"). Each ADC 197 shares the same input channels; although in other embodiments, each ADC 197 has unique input channels. Each ADC 197 comprises three input channel-select registers for a total of six input channel-select registers corresponding to six conversion groups. Additionally, the ADC 197 has an eight, ten, or twelve-bit resolution with high and low reference voltages. The total sample/hold/convert time is 600 ns, and shift operations can be saved by using only the eight or ten most significant bits of the conversion result. In at least one embodiment, the plurality of address offsets begins 8 kilobytes from an address that begins storing results of conversion by the ADC 197.

Figure 5:
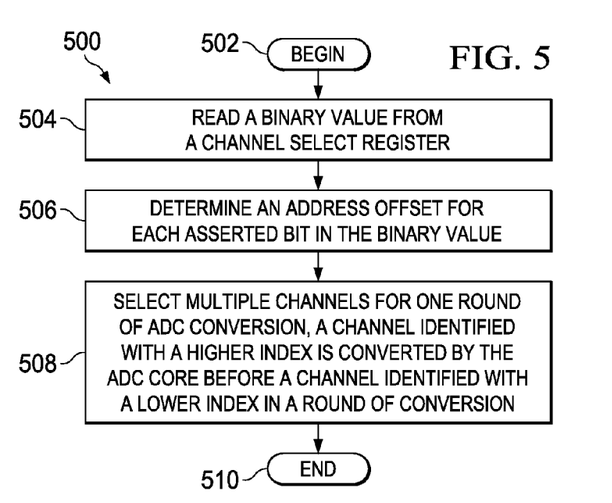
FIG. 5 shows a method of channel selection for an ADC according to at least one illustrated embodiment.

FIG. 5 illustrates a method 500 beginning at 502 and ending at 510. In at least one embodiment, a trigger starts the method 500. At 504, a binary value in a channel select register 102 is read. At 506, an address offset is determined for each asserted bit in the binary value. At 508, multiple channels are selected for conversion in one round of conversion by an analog-to-digital converter ("ADC") 197 based on the value. In at least one embodiment, a channel identified with a higher index is converted by the ADC core 195 before a channel identified with a lower index in the same round of conversion. Selecting multiple channels for conversion comprises selecting a channel based on a value at an address offset in at least one embodiment. The same channel can be selected more than once in the same round of conversion. Specifically, if two values at two address offsets are equal, then the corresponding channel will be selected more than once if each corresponding bit is asserted.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A microcontroller, comprising:
a microcontroller core;
an analog-to-digital converter ("ADC") coupled to said microcontroller core, wherein the ADC has multiple input channel multiplexers that are configured to receive multiple analog input channels; and
a selection register and a data structure, said data structure comprising a plurality of associated field sets;
wherein each bit position in the selection register indexes to one of the associated field sets in the data structure, the value contained in each such bit position indicating whether or not to select the corresponding associated field set for selection of an analog input channel; and
wherein each associated field set comprises one or more values collectively specifying an analog input channel to select for conversion to digital form.

2. The microcontroller of claim 1, wherein each associated field set in the data structure comprises a first control field comprising a first control value that specifies a corresponding input to each of the input channel multiplexers for output.

3. The microcontroller of claim 2, wherein each associated field set in the data structure comprises a second control field comprising a second control value that specifies which input channel multiplexer output to select for conversion to digital form.

4. The microcontroller of claim 3, further comprising a plurality of switches controlled by the second control value, the second control value determining which switch should close.

5. The microcontroller of claim 4, further comprising a multiplexer generating a first control signal and a second control signal based on the first control value and the second control value, respectively, wherein the first control signal is sent to the input channel multiplexers and wherein the second control signal is sent to the switches.

6. The microcontroller of claim 5, wherein the one or more values are changed by writing different values beginning the address offset.

7. The microcontroller of claim 1, wherein an order in which the analog input channels are converted in one round of conversion by the ADC is not an order of the analog input channels in increasing significance of each bit position of the selection register if each bit position represents a channel.

8. The microcontroller of claim 1, wherein the bit positions of the selection register correspond to address offsets in memory.

9. The microcontroller of claim 8, wherein the memory is random access memory ("RAM") of the microcontroller.

10. The microcontroller of claim 8, wherein the one or more values are stored beginning at the address offsets.

11. A system, comprising:
host logic; and
a microcontroller comprising an analog-to-digital converter ("ADC"), said microcontroller coupled to said ADC;
wherein multiple channels are selected for conversion in one round of conversion by the ADC via a binary value in a register;
wherein a channel identified with a higher index is converted by the ADC core before a channel identified with a lower index in a round of conversion;
wherein each bit of the binary value corresponds to a plurality of address offsets in memory;
wherein a value beginning at an address offset, out of the plurality of address offsets, is used to select one of the multiple channels.

12. The system of claim 11, wherein the value comprises 16 bits, 10 bits of the 16 bits being used, and 6 bits of the 16 bits being reserved.

13. The system of claim 12, wherein the 10 bits occupy 5 consecutive bits in each of 2 consecutive 8-bit words.

14. The system of claim 11, wherein the plurality of address offsets begin 8 kilobytes from an address that begins storing results of conversion by the ADC.

15. The system of claim 11, wherein the multiple channels comprise 1024 channels.

16. A method, comprising:
reading a binary value in a channel select register; and
selecting multiple channels for conversion in one round of conversion by an analog-to-digital converter ("ADC") based on the value;
wherein an order in which the multiple channels are converted in the one round of conversion by the ADC is not an order of the multiple channels in increasing significance of each bit of the binary values if each bit of the binary values represents a channel.

17. The method of claim 16, wherein selecting multiple channels for conversion comprises determining an address offset for each asserted bit in the binary value.

18. The method of claim 17, wherein selecting multiple channels for conversion comprises selecting a channel, out of the plurality of multiple channels, based on a value at an address offset, out of the plurality of address offsets.

19. The method of claim 18, wherein the value at the address offset is equal to a second value at a second address offset out of the plurality of address offsets.

20. The method of claim 16, wherein the multiple channels comprise one channel selected twice in the one round of conversion.

* * * * *